(12) United States Patent
Kim et al.

(10) Patent No.: US 9,252,095 B2
(45) Date of Patent: Feb. 2, 2016

(54) SEMICONDUCTOR PACKAGE AND METHOD OF FABRICATING THE SAME

(71) Applicants: Jongkook Kim, Hwaseong-si (KR); Su-min Park, Ansan-si (KR); Soojeoung Park, Hwaseong-si (KR); Bona Baek, Yongin-si (KR); Hohyeuk Im, Seoul (KR); Byoungwook Jang, Hwaseong-si (KR); Yoonha Jung, Suwon-si (KR)

(72) Inventors: Jongkook Kim, Hwaseong-si (KR); Su-min Park, Ansan-si (KR); Soojeoung Park, Hwaseong-si (KR); Bona Baek, Yongin-si (KR); Hohyeuk Im, Seoul (KR); Byoungwook Jang, Hwaseong-si (KR); Yoonha Jung, Suwon-si (KR)

(73) Assignee: Samsung Electronics Co., LTD., Gyeonggi-do (KR)

( * ) Notice: Subject to any disclaimer, the term of this patent is extended or adjusted under 35 U.S.C. 154(b) by 0 days.

(21) Appl. No.: 13/922,722

(22) Filed: Jun. 20, 2013

(65) Prior Publication Data
US 2014/0008795 A1    Jan. 9, 2014

(30) Foreign Application Priority Data

Jul. 9, 2012    (KR) ........................ 10-2012-0074722

(51) Int. Cl.
*H01L 23/498* (2006.01)
*H01L 21/56* (2006.01)
*H01L 23/00* (2006.01)
*H01L 23/13* (2006.01)
*H01L 25/065* (2006.01)
(Continued)

(52) U.S. Cl.
CPC .......... *H01L 23/49816* (2013.01); *H01L 21/56* (2013.01); *H01L 23/13* (2013.01); *H01L 23/49811* (2013.01); *H01L 24/97* (2013.01); *H01L 25/0657* (2013.01); *H01L 25/105* (2013.01); *H01L 21/561* (2013.01); *H01L 21/565* (2013.01); *H01L 23/3128* (2013.01); *H01L 2224/16225* (2013.01); *H01L 2224/32145* (2013.01); *H01L 2224/32225* (2013.01); *H01L 2224/48091* (2013.01); *H01L 2224/73265* (2013.01); *H01L 2224/97* (2013.01); *H01L 2225/0651* (2013.01); *H01L 2225/06517* (2013.01); *H01L 2225/06558* (2013.01); *H01L 2225/1023* (2013.01); *H01L 2225/1058* (2013.01); *H01L 2225/1076* (2013.01); *H01L 2924/15151* (2013.01); *H01L 2924/15311* (2013.01); *H01L 2924/18301* (2013.01)

(58) Field of Classification Search
CPC .................. H01L 23/49816; H01L 23/49811; H01L 23/31; H01L 23/3128; H01L 2225/06548
USPC .......................... 257/686, 738, 778, 779, 788
See application file for complete search history.

(56) References Cited

U.S. PATENT DOCUMENTS

| 5,767,446 | A |   | 6/1998  | Ha et al.      |         |
|-----------|---|---|---------|----------------|---------|
| 5,777,391 | A | * | 7/1998  | Nakamura et al.| 257/778 |
| 5,841,192 | A | * | 11/1998 | Exposito       | 257/701 |

(Continued)

FOREIGN PATENT DOCUMENTS

| KR | 20020043398 A | 6/2002 |
|----|---------------|--------|
| KR | 20060058376 A | 5/2006 |

(Continued)

*Primary Examiner* — Peniel M Gumedzoe
(74) *Attorney, Agent, or Firm* — Harness, Dickey & Pierce

(57) ABSTRACT

Provided are a semiconductor package and a method of fabricating the same. The package substrate includes a hole, which may be used to form a mold layer without any void. The mold layer may be partially removed to expose a lower conductive pattern. Accordingly, it is possible to improve routability of solder balls.

28 Claims, 23 Drawing Sheets

(51) Int. Cl.
*H01L 25/10* (2006.01)
*H01L 23/31* (2006.01)

(56) References Cited

U.S. PATENT DOCUMENTS

| | | |
|---|---|---|
| 8,241,968 B2 | 8/2012 | Lee et al. |
| 8,273,607 B2 | 9/2012 | Park et al. |
| 2009/0189297 A1* | 7/2009 | Sugawara et al. ............ 257/778 |
| 2011/0193228 A1 | 8/2011 | Yu et al. |
| 2012/0038063 A1 | 2/2012 | Meyer et al. |

FOREIGN PATENT DOCUMENTS

| | | |
|---|---|---|
| KR | 20060079996 A | 7/2006 |
| KR | 20070010312 A | 1/2007 |
| KR | 100691942 B1 | 3/2007 |
| KR | 100963151 B1 | 6/2010 |
| KR | 101111430 B1 | 2/2012 |
| KR | 101148434 B1 | 5/2012 |
| KR | 101173092 B1 | 8/2012 |

* cited by examiner

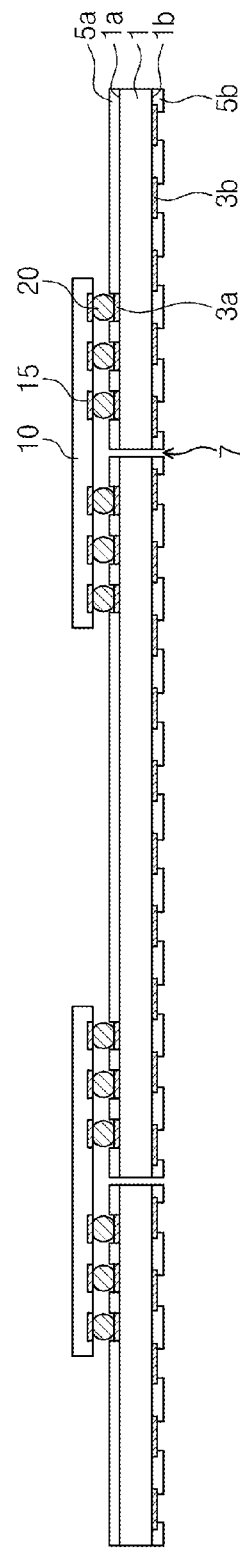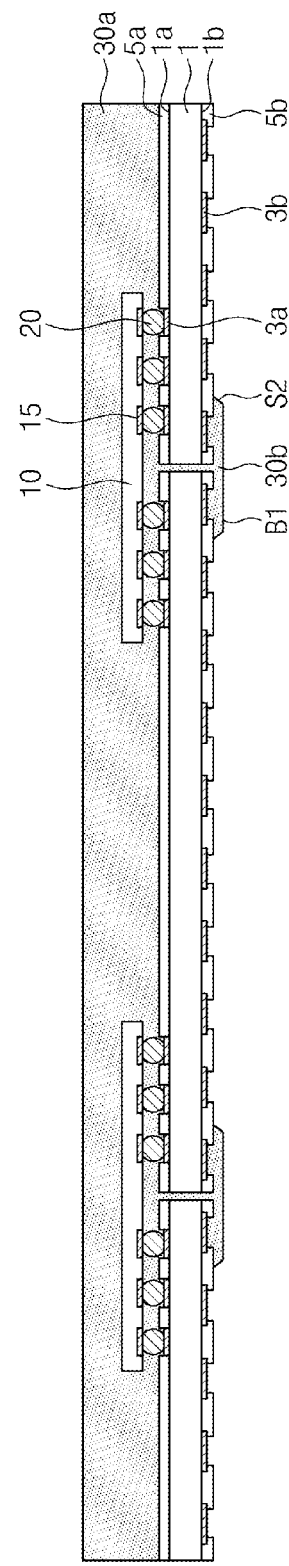

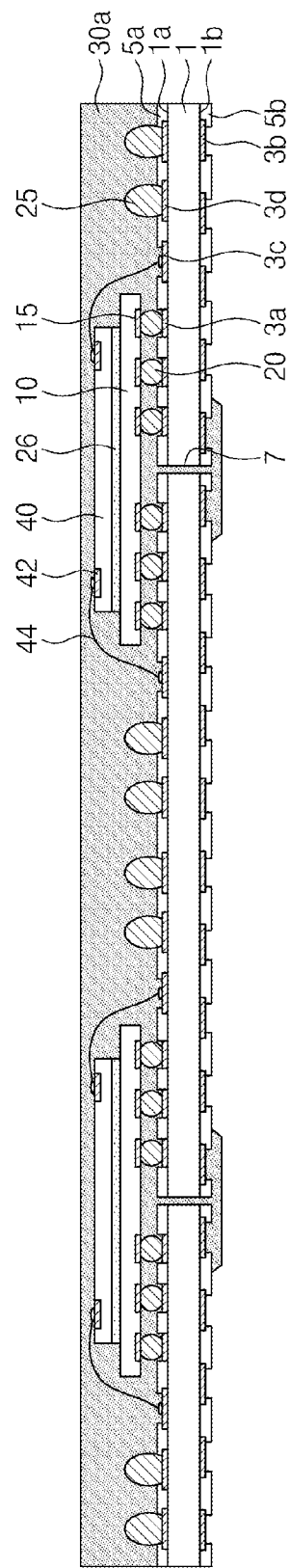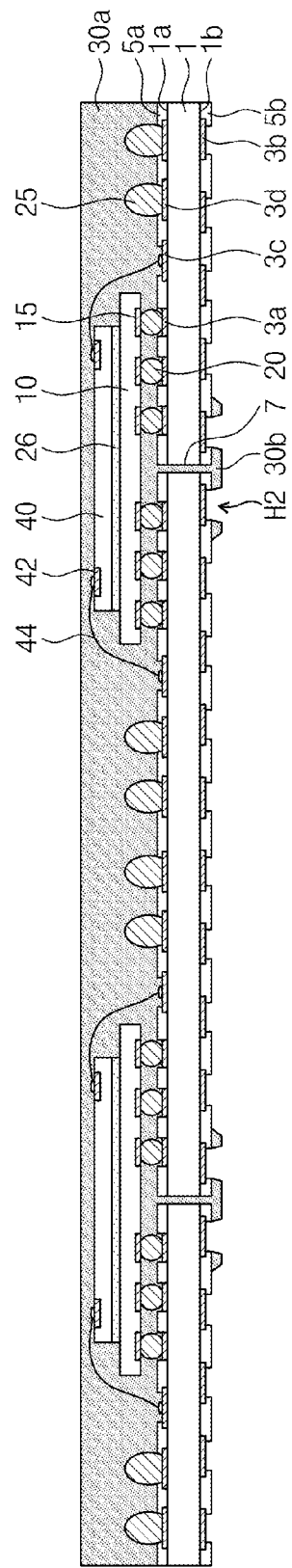

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0074722, filed on Jul. 9, 2012, in the Korean Intellectual Property Office, the entire contents of which are hereby incorporated by reference.

BACKGROUND OF THE INVENTION

Some example embodiments of inventive concepts include a semiconductor package and/or a method of fabricating the same.

High performance, high speed and small sized electronic systems are in greater demand as the electronic industry continues to develop. In response to this demand, various semiconductor package techniques have been proposed. For example, a flip-chip bonding technique has been proposed capable of reducing a routing length between pads and consequently having an improved signal transmission speed, compared with that of a wire-bonding technique. Further, the use of the flip-chip bonding technique can reduce the risk of electrical shorts between wires. However, a void may be formed between bumps when a semiconductor package is fabricated using the flip-chip bonding technique. To overcome this problem, an under-fill resin layer may be provided to fill a gap between the bumps. However, if the under-fill resin layer is used, a dam is needed to prevent an unintentional flow of the under-fill resin solution, and thus, it is hard to reduce horizontal and vertical sizes of the semiconductor package.

SUMMARY

Some example embodiments of inventive concepts provide a semiconductor package with a high speed and a small form factor.

Other example embodiments of inventive concepts provide a simplified method of fabricating a semiconductor package.

According to some example embodiments of inventive concepts, a semiconductor package may include a package substrate with at least one hole, at least one lower conductive pattern on a bottom surface of the package substrate, at least one semiconductor chip mounted on the package substrate in a flip-chip bonding manner, and a mold layer on the package substrate. The mold layer may include an upper mold portion covering the at least one semiconductor chip and a top surface of the package substrate, and a lower mold portion connected to the upper mold portion through the at least one hole to cover at least a portion of the bottom surface of the package substrate and expose at least a portion of the lower conductive pattern. The lower mold portion may include a mold bottom surface defining a lower mold hole exposing the at least one portion of the lower conductive pattern.

In some example embodiments, the lower mold portion may include a first mold side surface adjacent to the lower conductive pattern, the mold bottom surface may be the lowermost surface of the lower mold portion, and the mold bottom surface may have a surface roughness different from that of the first mold side surface.

In some example embodiments, the mold bottom surface has a first surface roughness, and the first mold side surface has a second surface roughness greater than the first surface roughness.

In some example embodiments, the first mold side surface corresponds to an inner side surface of the lower mold hole.

In some example embodiments, the package may further include an insulating layer between the bottom surface of the package substrate and the lower mold portion to cover at least a portion of the lower conductive pattern. The insulating layer may include a lower insulator hole overlapping the lower mold hole, and an inner width of the lower insulator hole may be equivalent to or greater than that of the lower mold hole.

In some example embodiments, the package may further include at least one lower solder ball in contact with the lower conductive pattern. The at least one lower solder ball may be adjacent to the first mold side surface.

In some example embodiments, a height from the bottom surface of the package substrate to the mold bottom surface may be less than a height from the bottom surface of the package substrate to a bottom of the lower solder ball.

In some example embodiments, the lower mold portion may be between adjacent ones of the lower solder balls.

In some example embodiments, the package may further include an upper solder ball provided on the top surface of the package substrate. The upper mold portion may include an upper mold hole exposing the upper solder ball, and an inner side surface of the upper mold hole has a surface roughness substantially the same surface roughness as the second surface roughness.

In some example embodiments, the package may further include an upper semiconductor package provided on the upper mold portion and electrically connected to the package substrate via the upper solder ball.

In some example embodiments, the lower mold portion extends from a first edge of the bottom surface of the package substrate to a second edge of the bottom surface opposite the first edge or covers the entire bottom surface of the package substrate.

In some example embodiments, the lower mold portion has a second mold side surface aligned to a side surface of the package substrate, the second mold side surface having a surface roughness different from the first mold side surface.

In some example embodiments, the upper mold portion fills a space between the semiconductor chip and the package substrate.

According to some example embodiments of inventive concepts, a method of fabricating a semiconductor package may include mounting at least one semiconductor chip on a package substrate in a flip-chip bonding manner, the package substrate including a top surface and a bottom surface facing each other, at least one hole from the top surface to the bottom surface, and at least one lower conductive pattern provided on the bottom surface, forming a mold layer including an upper mold portion and a lower mold portion, the upper mold portion covering at least a portion of the top surface of the package substrate, the lower mold portion connected to the upper mold portion through the at least one hole to cover at least a portion of the bottom surface of the package substrate, and removing a portion of the lower mold portion to expose at least a portion of the lower conductive pattern.

In some example embodiments, the removing a portion of the lower mold portion may be performed using a laser.

In some example embodiments, the method may further include attaching a lower solder ball to the lower conductive pattern, and sequentially cutting the upper mold portion, the package substrate, and the lower mold portion to form unit semiconductor packages separated from each other.

In some example embodiments, the package substrate may further include a first upper solder ball attached to the package substrate. The first upper solder ball may be covered with the upper mold portion. The method may further include removing a portion of the upper mold portion to form an upper mold hole exposing at least a portion of the first upper solder ball.

In some example embodiments, the removing the portion of the lower mold portion and the removing the portion of the upper mold portion may use the same process.

In some example embodiments, the method may further include positioning an upper semiconductor package, the upper semiconductor package including an upper package substrate, an upper semiconductor chip mounted on the upper package substrate, and a second upper solder ball attached to a bottom surface of the upper package substrate, on the upper mold portion so that the first upper solder ball is in contact with the second upper solder ball, and welding the first and second upper solder balls by providing heat thereto.

In some example embodiments, the package substrate may further include an insulating layer covering a bottom surface of the package substrate and exposing a portion of the lower conductive pattern, and the removing the portion of the lower mold portion partially removes the insulating layer.

According to some example embodiments of inventive concepts, a semiconductor package may include a package substrate; a lower conductive pattern on a lower surface of the package substrate; at least one semiconductor chip mounted above an upper surface of the package substrate in a flip-chip bonding manner; and a mold layer, the mold layer including an upper mold portion over the at least one semiconductor chip and over at least a portion of the upper surface of the package substrate, a lower mold portion covering at least a portion of the lower surface of the package substrate and exposing at least a portion of the lower conductive pattern covered by the lower mold portion, and a connecting portion extending through the package substrate and integrally connecting the upper mold portion and the lower mold portion.

In some example embodiments, the semiconductor package may further include an insulating layer between the lower surface of the package substrate and the lower mold portion, the insulating layer covering at least a portion of the lower conductive pattern and exposing at least a portion of the lower conductive pattern covered by the insulating layer and exposed by the lower mold portion.

In some example embodiments, a width of the at least a portion of the lower conductive pattern exposed by the insulating layer is equivalent to or greater than a width of the at least a portion of the lower conductive pattern exposed by the lower mold portion.

In some example embodiments, the lower mold portion includes a bottom surface, the bottom surface being a lowermost surface of the lower mold portion, and a mold side surface connected to the bottom surface where the lower mold portion exposes at least a portion of the lower conductive pattern, the mold side surface having a side surface roughness different than a bottom surface roughness of the bottom surface.

In some example embodiments, the side surface roughness is greater than the bottom surface roughness.

In some example embodiments, the semiconductor package may further include at least one lower solder ball in contact with the lower conductive pattern and adjacent to the mold side surface.

In some example embodiments, a height from the bottom surface of the package substrate to the bottom surface of the lower mold portion is less than a height from the bottom surface of the package substrate to a bottom of the lower solder ball.

In some example embodiments, the semiconductor package may further include an upper solder ball provided on the upper surface of the package substrate, wherein the upper mold portion exposes at least a portion of the upper solder ball, and an inner side surface of the upper mold portion is substantially the same surface roughness as the side surface roughness of the lower mold portion.

In some example embodiments, the semiconductor package may further include an upper semiconductor package provided on the upper mold portion and electrically connected to the package substrate via the upper solder ball.

In some example embodiments, the upper mold portion fills a space between the at least one semiconductor chip and the upper surface of the package substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4, 5 and 7 are sectional views illustrating a process of fabricating a semiconductor package, whose section is shaped like that shown in FIG. 1B.

FIGS. 10 through 15 are sectional views illustrating a process of fabricating a semiconductor package, whose section is shaped like that shown in FIG. 8B.

Figure 1A:
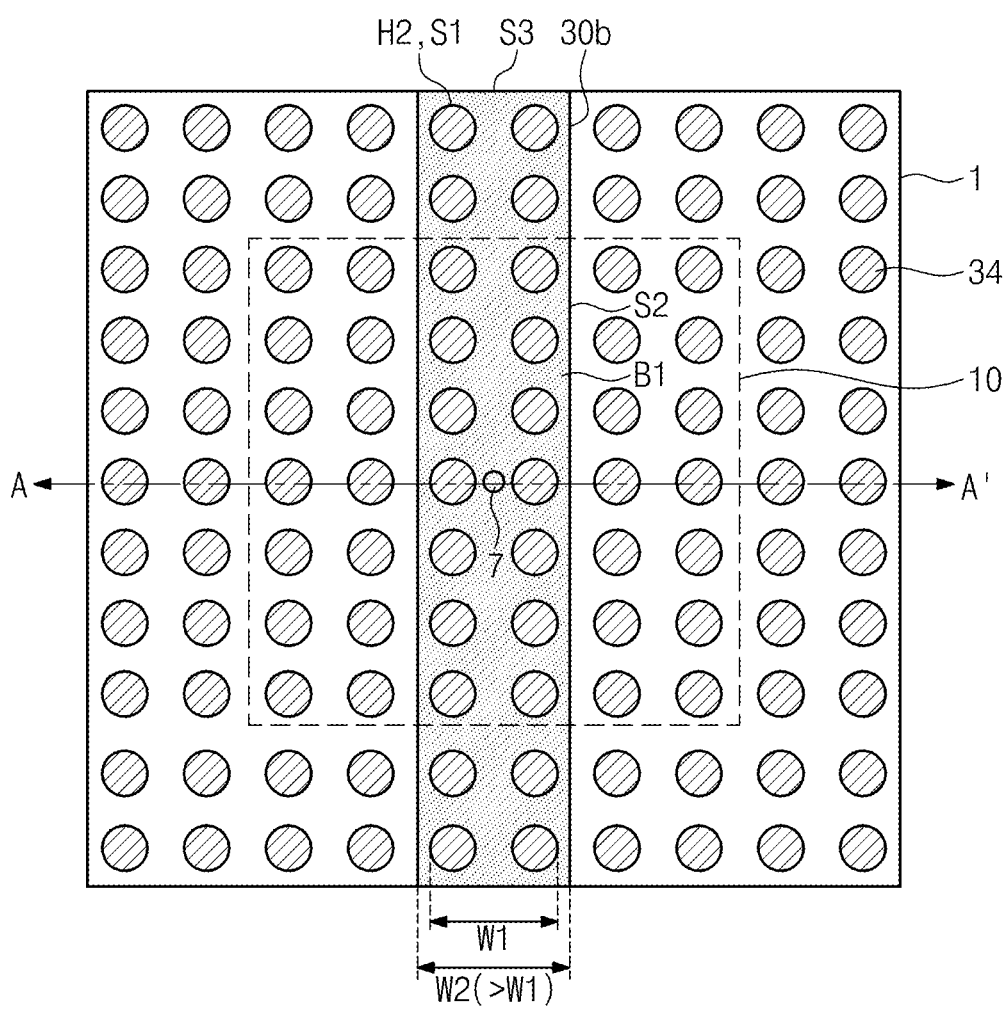
FIG. 1A is a plan view illustrating a bottom surface of a package substrate according to some example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Some example embodiments of inventive concepts will now be described more fully with reference to the accompanying drawings, in which some example embodiments are shown. Example embodiments of inventive concepts may, however, be embodied in many different forms and should not be construed as being limited to the example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of some example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a uradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example Embodiments

Figure 1B:
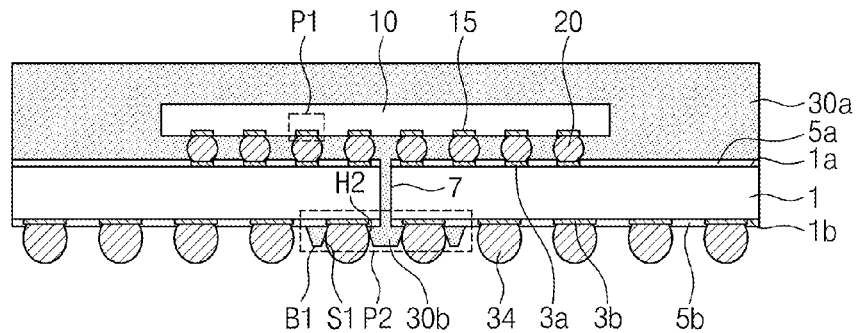
FIG. 1B is a sectional view taken along a line A-A' of FIG. 1A.
Figure 1C:
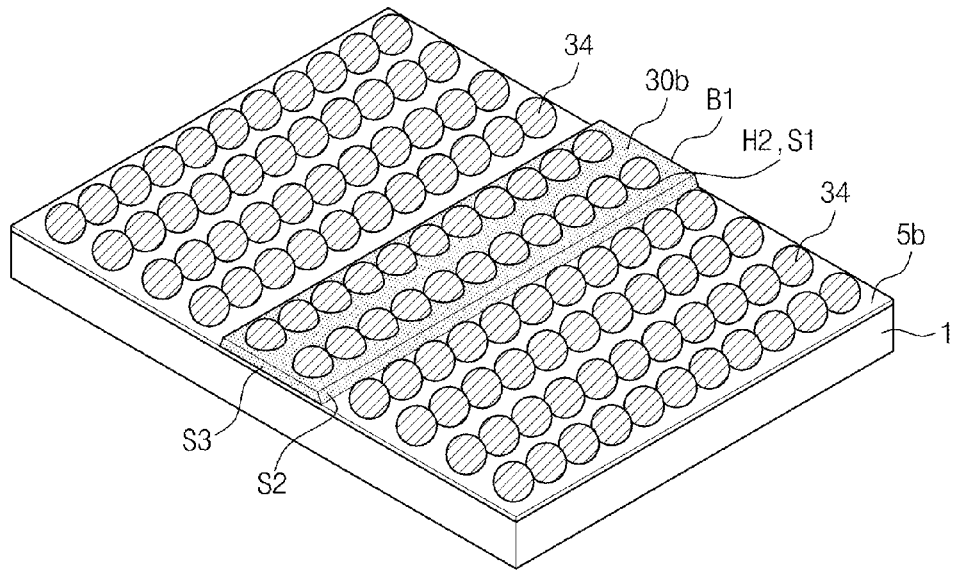
FIG. 1C is a perspective view of the bottom surface of the package substrate according to some example embodiments of inventive concepts.

FIG. 1A is a plan view illustrating a bottom surface of a package substrate according to some example embodiments of inventive concepts. FIG. 1B is a sectional view taken along a line A-A' of FIG. 1A. FIG. 1C is a perspective view of the bottom surface of the package substrate according to some example embodiments of inventive concepts.

Referring to FIGS. 1A, 1B and 1C, a semiconductor package may include a package substrate 1. The package substrate 1 may be a printed circuit board of a singe-layered or multi-layered structure. The package substrate 1 may be formed of bismaleimide triazine resin, alumina-based ceramics, glass-based ceramics or silicon. The package substrate 1 may include a top surface 1a and a bottom surface 1b facing each other. The package substrate 1 may have at least one hole 7 that penetrates the package substrate 1 and connects the top surface 1a to the bottom surface 1b. An upper conductive pattern 3a may be provided on the top surface 1a of the package substrate 1, and a lower conductive pattern 3b may be provided on the bottom surface 1b. The lower conductive pattern 3b may be, for example, a ball land. The lower conductive pattern 3b may be formed of a conductive material reflecting but not absorbing a laser. For example, the lower conductive pattern 3b may be formed of at least one of nickel, lead, gold and copper. The upper conductive pattern 3a may be formed of the same material as the lower conductive pattern 3b, but example embodiments are not limited thereto. The top surface 1a and the bottom surface 1b may be covered with an upper insulating layer 5a and a lower insulating layer 5b, respectively. The upper and lower insulating layers 5a and 5b may serve as a solder resist layer and be formed of for example, a photo-sensitive resist layer. The hole 7 may extend into at least one of the upper and lower insulating layers 5a and 5b.

A semiconductor chip 10 may be mounted on the top surface 1a of the package substrate 1 in a flip-chip bonding manner. The semiconductor chip 10 may include bonding pads 15. The bonding pads 15 may be connected to the upper conductive patterns 3a via bumps 20. The hole 7 may overlap the semiconductor chip 10. For example, the hole 7 may overlap centers of the package substrate 1 and/or the semiconductor chip 10.

Figure 2:
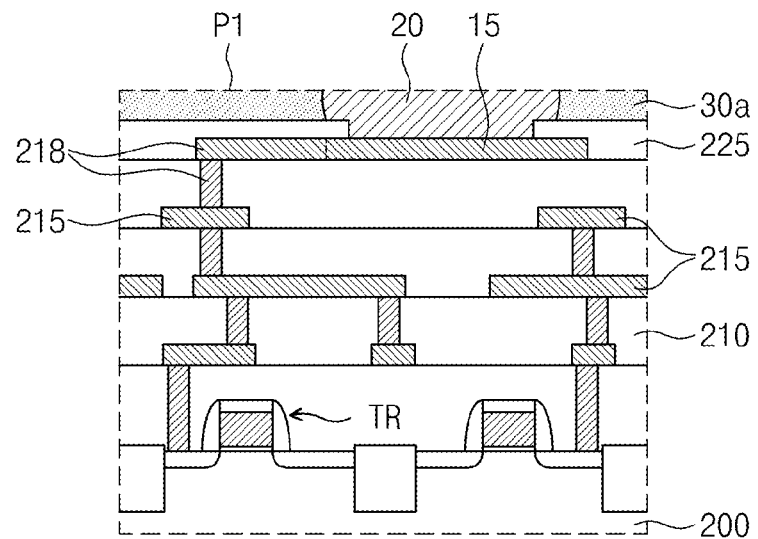
FIG. 2 is an enlarged sectional view illustrating a portion 'P1' of FIG. 1B.

FIG. 2 is an enlarged sectional view illustrating a portion 'P1' of FIG. 1B.

Referring to FIGS. 1B and 2, the first semiconductor chip 10 may include a semiconductor substrate 200 and a plurality of transistors TR that are provided on the semiconductor substrate 200 and are electrically connected to wires 215. The transistors TR may be used as a part of a logic or non-memory element or as a switching element of a data storing element (e.g., a capacitor). The wires 215 and the transistors TR may be covered with an interlayered insulating layer 210. The uppermost ones of the wires 215 may be electrically connected to the bonding pads 15 via re-distributed lines 218. The re-distributed lines 218 and the bonding pads 15 may be partially covered with a passivation layer 225. The bumps 20 may be provided on first bonding pads 15a. The bumps 20 may be formed of a metal (for example, lead, tin, indium, bismuth, antimony, silver or alloys thereof).

Referring to FIGS. 1A, 1B and 1C, a mold layer 30a and 30b may be provided on the package substrate 1. The mold layer 30a and 30b may include an upper mold portion 30a and a lower mold portion 30b. The semiconductor chip 10 and the top surface 1a of the package substrate 1 may be covered with the upper mold portion 30a. The upper mold portion 30a may extend to fill spaces between the semiconductor chip 10 and the package substrate 1 and between the bumps 20. According to some example embodiments of inventive concepts, the space between the semiconductor chip 10 and the package substrate 1 may be filled with the upper mold portion 30a without an under-fill resin layer and without a void. Accordingly, an under-fill resin layer may not be included, which may simplify a fabrication process. The lower mold portion 30b may be connected to the upper mold portion 30a through the hole 7 and cover a portion of the bottom surface 1b of the package substrate 1. The upper mold portion 30a and the lower mold portion 30b may be provided in the form of single body without any interfacial surface therebetween and be formed of the same material. The lower mold portion 30b in the hole 7 may be a connecting portion extending through the package substrate and integrally connecting the upper mold portion and the lower mold portion.

The mold layer 30a and 30b may include a resin layer and a plurality of filler particles distributed in the resin layer. The resin layer may include at least one polymer material. The filler particles may include, for example, silica or alumina. In some example embodiments, a width W2 of the lower mold portion 30b may be greater than a distance W1 between outer surfaces of a pair of lower solder balls 34 most adjacent to the hole 7. For example, the lower mold portion 30b may be formed to have a linear structure covering sidewalls of two columns of the lower solder balls 34 most adjacent to the hole 7. The lower mold portion 30b may include a bottom surface protruding from the bottom surface 1b of the package substrate 1. The upper insulating layer 5a may be provided between the top surface 1a of the package substrate 1 and the upper mold portion 30a and cover some of the upper conductive patterns 3a or a portion of the upper conductive patterns 3a. The lower insulating layer 5b may be provided between the bottom surface 1b of the package substrate 1 and the lower mold portion 30b and cover some of the lower conductive patterns 3b or a portion of the lower conductive patterns 3b.

Figure 3A:
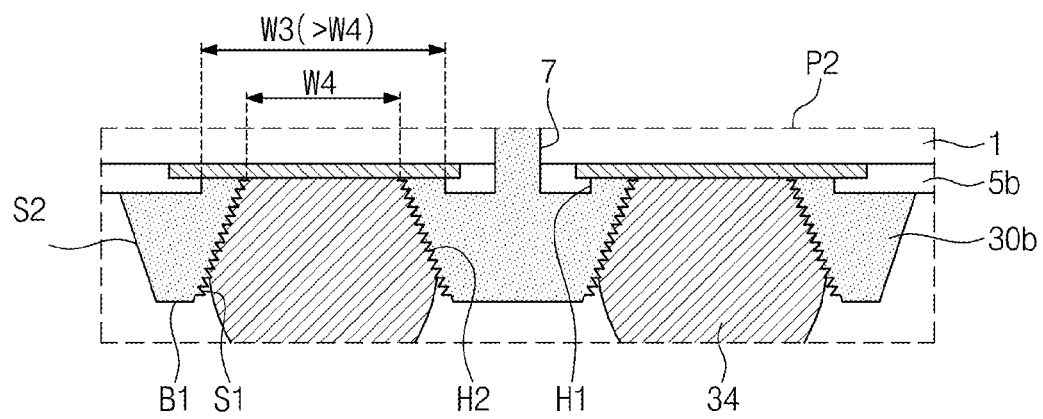
FIGS. 3A and 3B are enlarged sectional views illustrating examples of a portion 'P2' of FIG. 1B.
Figure 3B:
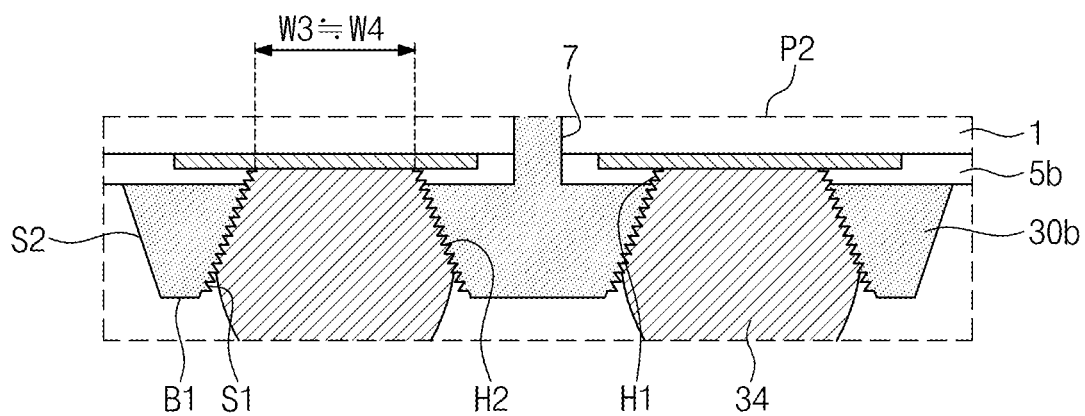

FIGS. 3A and 3B are enlarged sectional views illustrating examples of a portion 'P2' of FIG. 1B.

Referring to FIGS. 1B, 1C, 3A and 3B, the lower insulating layer 5b may be formed to have a lower insulator hole H1 exposing the lower conductive pattern 3b. The lower mold portion 30b may overlap the lower insulator hole H1 and have a lower mold hole H2 exposing the lower conductive pattern 3b. A width W3 of the lower insulator hole H1 may be greater than a width W4 of the lower mold hole H2 at the lower conductive pattern 3b, as shown in FIG. 3A, or be equivalent to the width W4 of the lower mold hole H2 at the lower conductive pattern 3b, as shown in FIG. 3B. The lower mold portion 30b may include a first mold side surface S1, a second mold side surface S2, a third mold side surface S3, and a mold bottom surface S1 connecting the first to third mold side surfaces S1, S2 and S3. The first mold side surface S1 may be formed using a laser drilling process. The second mold side surface S2 may be formed using a mold process. The third mold side surface S3 may be formed using a singulation process. Accordingly, the mold side surfaces S1, S2, and S3 may be formed to have a difference in surface roughness between each other. The first mold side surface S1 may correspond to an inner sidewall of the lower mold hole H2. A surface roughness of the first mold side surface S1 (such as, a center-line average or roughness average Ra or a ten point height Rz) may be, for example, about 2 nm. The second mold side surface S2 may be positioned opposite the first mold side surface S1. The second mold side surface S2 may have substantially the same surface roughness as the mold bottom surface B1. The first mold side surface S1 may have a surface roughness greater than those of the second mold side surface S2 and the mold bottom surface B1. The third mold side surface S3 may be aligned to a sidewall of the package substrate 1. The lower solder balls 34 may be provided within the lower mold hole H2 to be in contact with the lower conductive pattern 3b. The lower solder balls 34 may be in partial contact with the first mold side surface S1. A distance from the bottom surface 1b to a bottom surface of the lower mold portion 30b may be smaller than a height of the lower solder ball 34. For example, the bottom surface of the lower mold portion 30b may be closer to the bottom surface 1b, compared with the bottom of the lower solder ball 34. The lower solder balls 34 may be spaced apart from the lower mold portion 30b. The lower solder balls 34 may be formed of a metal (for example, lead, tin, indium, bismuth, antimony, silver or alloys thereof).

The lower mold portion 30b may be between adjacent ones of the lower solder balls 34 to prevent an electrical short between the lower solder balls 34.

Figure 7:
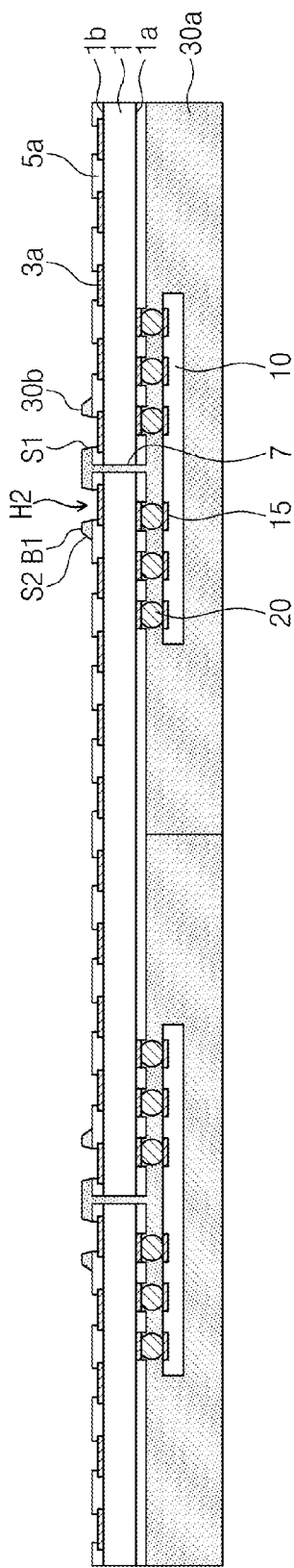

FIGS. 4, 5 and 7 are sectional views illustrating a process of fabricating a semiconductor package, whose section is shaped like that shown in FIG. 1B.

Referring to FIG. 4, a package substrate 1 may be prepared. The package substrate 1 may include a top surface 1a and a bottom surface 1b facing each other, an upper conductive pattern 3a and a lower conductive pattern 3b provided on the top and bottom surfaces 1a and 1b, respectively, a hole 7 connecting the top surface 1a to the bottom surface 1b, and an upper insulating layer 5a and a lower insulating layer 5b covering the top and bottom surfaces 1a and 1b, respectively. A semiconductor chip 10 may be provided on the package substrate 1. The semiconductor chip 10 may include bonding pads 15 and bumps 20. Thereafter, the resulting structure may be heated to a temperature of a melting point of the bump 20 or more, such that the bump 20 may be welded on the upper conductive pattern 3a. Accordingly, semiconductor chip 10 may be mounted on the top surface 1a of the package substrate 1 in a flip-chip bonding manner.

Referring to FIG. 5, a molding process may be performed to form upper and lower mold portions 30a and 30b. Hereinafter, the molding process will be described in more detail.

Figure 6A:
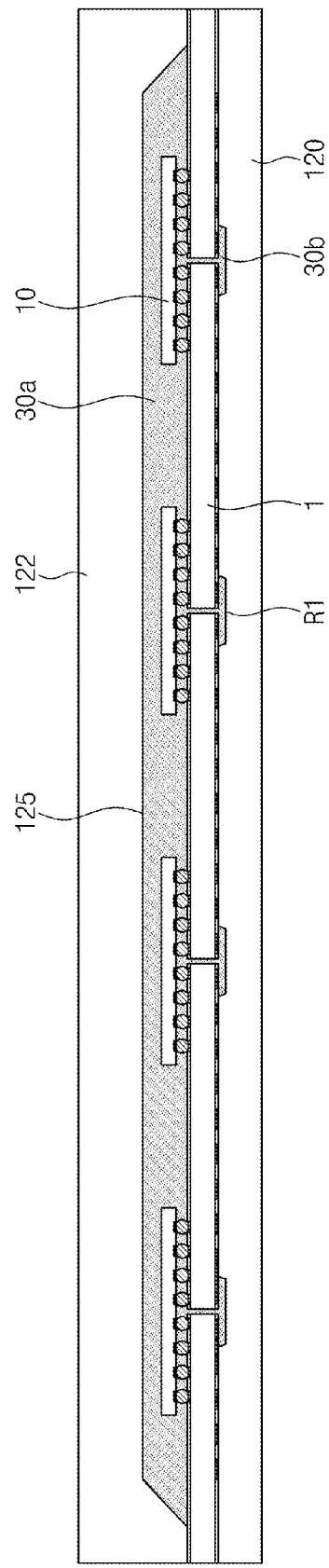
FIG. 6A is a sectional view illustrating a molding process according to some example embodiments of inventive concepts.
Figure 6B:
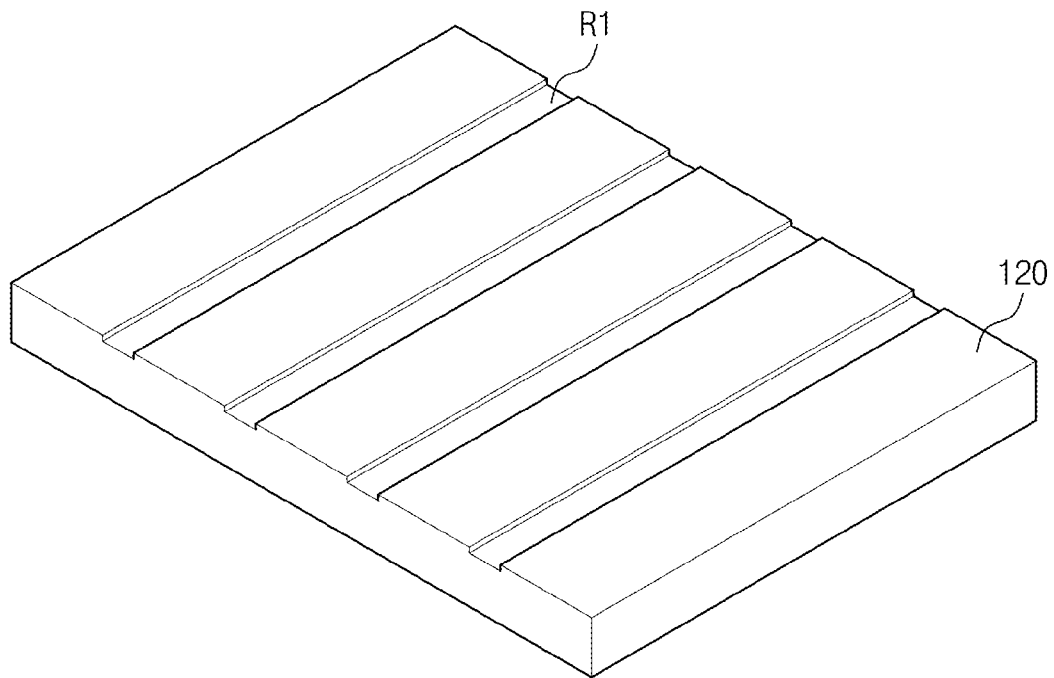
FIG. 6B is a perspective view illustrating a lower mold according to some example embodiments of inventive concepts.

FIG. 6A is a sectional view illustrating a molding process according to some example embodiments of inventive concepts. FIG. 6B is a perspective view illustrating a lower mold according to some example embodiments of inventive concepts.

Referring to FIGS. 5, 6A and 6B, the package substrate 1 may be disposed between a lower mold 120 and an upper mold 122. The lower mold 120 may be formed to delimit a plurality of line-shaped recess regions R1, each of which overlap the hole 7 to define a shape of the lower mold portion 30b. The upper mold 122 may be formed to delimit a subsided portion 125 defining a shape of the upper mold portion 30a. In addition, a resin solution inlet (not shown), to which a resin solution for forming a mold layer will be supplied, may be formed at one side of the upper mold 122. When a resin solution starts to be supplied from the resin solution inlet (not shown), air between the lower mold 120 and the upper mold 122 may be exhausted from an outlet (not shown) spaced apart from the resin solution inlet (not shown). The hole 7 may serve as an air vent and maintain a forward flowing of the resin solution. This may prevent a void from being produced or reduce the number of voids being produced. In the absence of the hole 7, there may be a difference in flowing speed of the resin solution and, thus, a void may be produced between the bumps. If the void is produced between the bumps, the bumps may be melted and connected to each other in a subsequent reflow process, and this may result in an electrical short between the bumps. In addition, if the void is filled with moisture, the void may be burst by an expansion of the moisture in a subsequent high-temperature process. According to some example embodiments of inventive concepts, due to the presence of the hole 7, the resin solution may fill the subsided portion 125, the recess region R1, and a space between the semiconductor chip 10 and the package substrate 1, without any void or with fewer voids. The resin solution may be converted into the mold layer 30a and 30b in a subsequent curing process, and the molds 122 and 120 may be removed. Accordingly, the upper mold portion 30a may be formed to cover the semiconductor chip 10 and the top surface 1a of the package substrate 1 and fill the space between the semiconductor chip 10 and the package substrate 1, and the lower mold portion 30b may be formed to cover the bottom surface 1b of the package substrate 1. The upper and lower mold portions 30a and 30b may be connected to each other and be simultaneously formed using the same process. Further, the mold bottom surface B1 and the second sidewall S2 of the lower mold portion 30b may be defined as the result of this process. The second sidewall S2 may be formed by the mold process. The second sidewall S2 may be formed by an inner sidewall of the recessed region R1 of the lower mold 120. In certain example embodiments, the lower mold portion 30b may be formed to fully or partially cover the lower conductive pattern 3b. This may lead to a difficulty in attaching the solder ball 34 to the lower conductive pattern 3b, due to the presence of the lower mold portion 30b.

Referring to FIG. 7, the lower mold portion 30b may be, at least partially removed to expose the lower conductive pattern 3b. The removal of the lower mold portion 30b may be performed using a laser (e.g., an infrared laser having a wavelength of about 1064 nm). In some example embodiments, an output power of the laser may be about 7 W. By the use of the laser, the lower mold portion 30b may be heated to a temperature capable of burning off the resin layer or the polymer layer constituting the lower mold portion 30b. For example, if the lower mold portion 30b includes a polymer layer made of an epoxy mold compound, the laser illumination process may be performed in such a way that the lower mold portion 30b is heated to a temperature of about 300-500° C. In some example embodiments, a removal rate of the lower mold portion 30b may be about 650 mm/sec. Accordingly, the lower conductive pattern 3b may be exposed. Since the lower conductive pattern 3b may be formed of a reflective material (e.g., at least one selected from the group consisting of nickel, lead, gold, and copper), it is possible to prevent the lower conductive pattern 3b from being damaged by the laser. When a portion of the lower mold portion 30b is removed by the laser, a portion of the lower insulating layer 5b may also be removed. As the result of the process of removing a portion of the lower mold portion 30b with the laser, the lower mold hole H2 may be formed to expose the lower conductive pattern 3b, while the first mold side surface S1 may be formed to have a rugged surface as shown in FIGS. 3A and 3B.

Referring back to FIGS. 1A and 1B, a singulation process may be performed to cut the upper mold portion 30a, the package substrate 1, and the lower mold portion 30b by unit semiconductor package. The singulation process may be performed using a diamond cutting knife. As the result of the singulation process, the third mold side surface S3 may be formed. Thereafter, the lower solder balls 34 may be attached or welded to the lower conductive patterns 3b. The attaching or welding process of the lower solder balls 34 may be performed before the singulation process.

According to some example embodiments of inventive concepts, the lower mold portion 30b may be removed, for example, using a laser to expose the lower conductive pattern 3b. Accordingly, the formation of the lower solder balls 34 may not be disturbed by the presence of the lower mold portion 30b, and the solder balls 34 may be formed with improved routability. In addition, the lower mold portion 30b may be formed without any limitation on its shape or with fewer limitations on its shape.

The first to third mold side surfaces S1, S2, and S3 of the lower mold portion 30b may be formed by the laser drilling process, the mold process, and the singulation process, respectively, to have different surface roughness from each other.

Other Example Embodiments

Figure 8A:
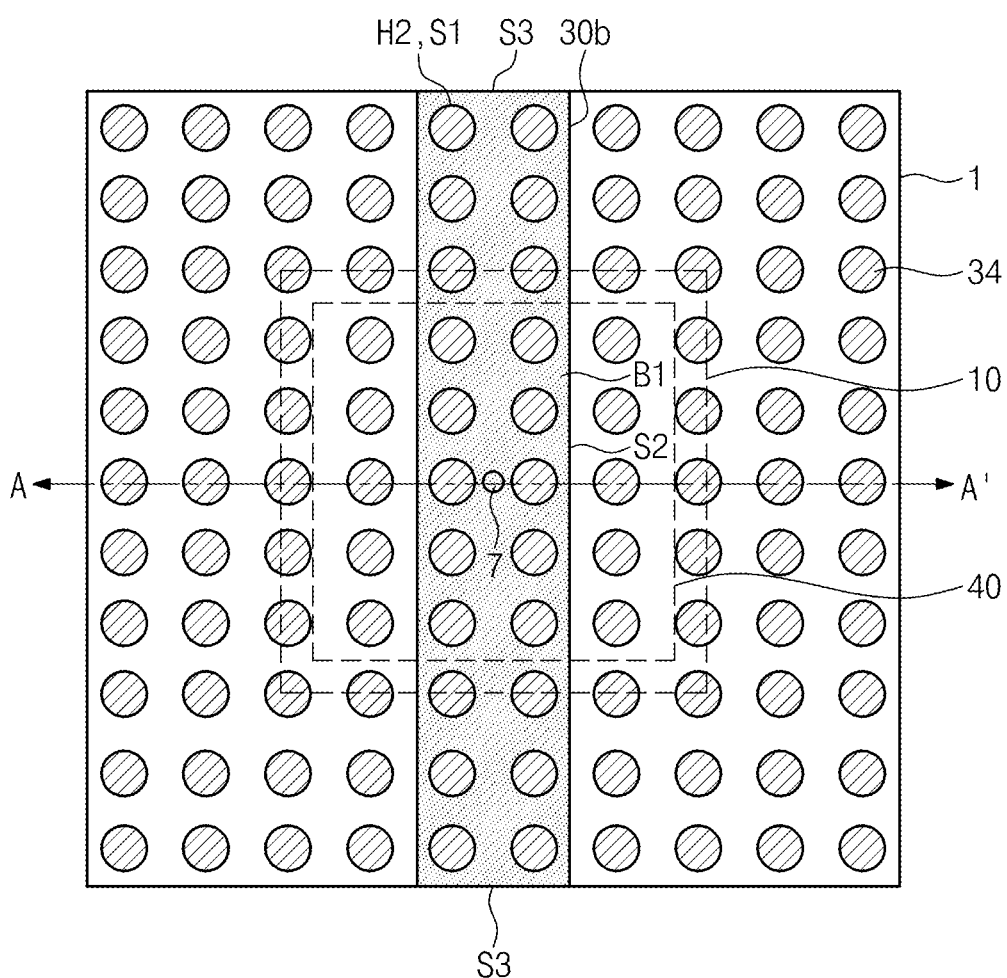
FIG. 8A is a plan view illustrating a bottom surface of a package substrate according to other example embodiments of inventive concepts.
Figure 8B:
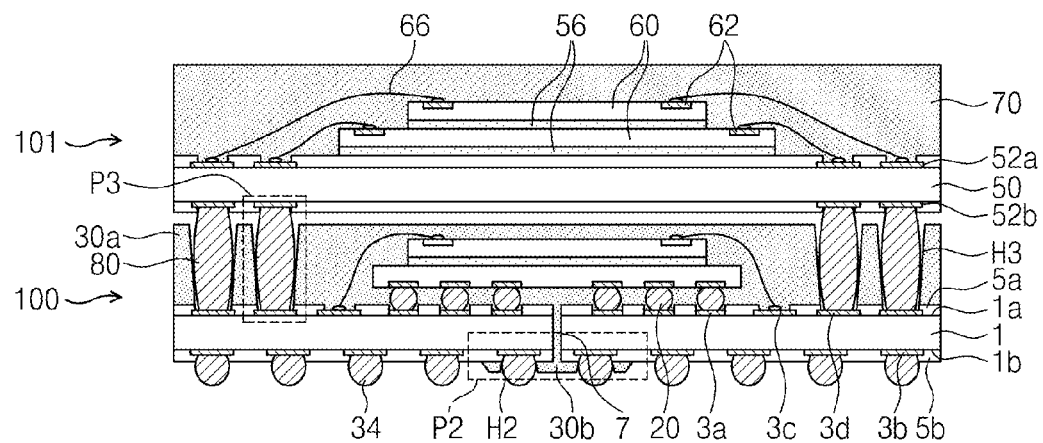
FIG. 8B is a sectional view taken along a line A-A' of FIG. 8A.
Figure 9:
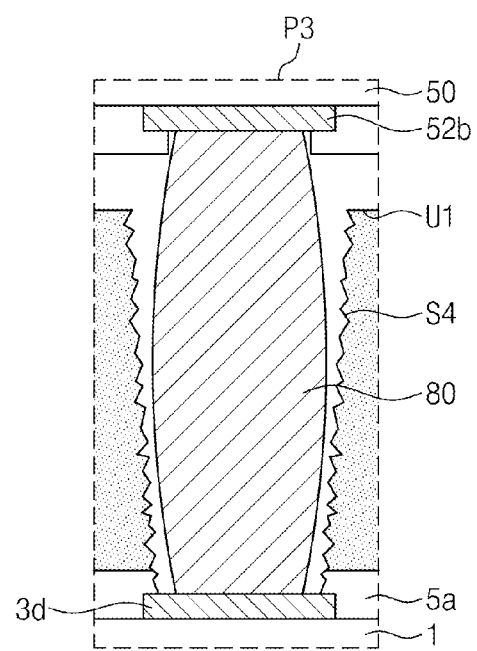
FIG. 9 is an enlarged sectional view illustrating a portion 'P3' of FIG. 8B.

FIG. 8A is a plan view illustrating a bottom surface of a package substrate according to other example embodiments of inventive concepts. FIG. 8B is a sectional view taken along a line A-A' of FIG. 8A. FIG. 9 is an enlarged sectional view illustrating a portion P3' of FIG. 8B.

Referring to FIGS. 8A, 8B and 9, a semiconductor package may be provided as a package-on-package structure, in which a second semiconductor package 101 is mounted on a first semiconductor package 100.

The first semiconductor package 100 may include a first package substrate 1. The first package substrate 1 may include a top surface 1a and a bottom surface 1b facing each other. The first package substrate 1 may include a hole 7 penetrating the first package substrate 1 and connecting the top surface 1a to the bottom surface 1b. First to third upper conductive patterns 3a, 3c, and 3d may be provided on the top surface 1a of the first package substrate 1, and a first lower conductive pattern 3b may be provided on the bottom surface 1b. The top surface 1a and the bottom surface 1b may be covered with an upper insulating layer 5a and a lower insulating layer 5b, respectively. A first semiconductor chip 10 may be mounted on the top surface 1a of the package substrate 1 in a flip-chip bonding manner. A first bonding pad 15 of the first semiconductor chip 10 may be connected to the first upper conductive pattern 3a using a bump 20. The hole 7 may overlap the first semiconductor chip 10. A second semiconductor chip 40 may be attached to the first semiconductor chip 10 using a first adhesion layer 26 interposed therebetween. A second bonding pad 42 of the second semiconductor chip 40 may be connected to the second upper conductive pattern 3c using a first wire 44.

The first and second semiconductor chips 10 and 40 and the first package substrate 1 may be covered with a first upper mold portion 30a. The first upper mold portion 30a may extend to fill spaces between the first semiconductor chip 10 and the first package substrate 1 and between the bumps 20. A lower mold portion 30b may be connected to the first upper mold portion 30a through the hole 7 and cover a portion of the bottom surface 1b of the package substrate 1. In some example embodiments, the first upper mold portion 30a and the lower mold portion 30b may be provided in the form of single body without any interfacial surface therebetween and be formed of the same material. In some example embodiments, the lower mold portion 30b may be formed to have a line shape crossing a center of the bottom surface 1b, in plan view. The bottom surface of the lower mold portion 30b may protrude from the bottom surface 1b of the first package substrate 1. A portion 'P2' of FIG. 8B may be shaped like that depicted in FIGS. 3A and 3B. Accordingly, a detailed description on this will be omitted.

The second semiconductor package 101 may include a second package substrate 50. A fourth upper conductive pattern 52a and a second lower conductive pattern 52b may be provided on a top surface and a bottom surface of the second package substrate 50, respectively. A plurality of third semiconductor chips 60 may be mounted on the second package substrate 50 in a wire-bonding manner. For example, third bonding pads 62 provided on the third semiconductor chips 60 may be connected to the fourth upper conductive patterns 52a using second wires 66. The third semiconductor chips 60 may be attached to the second package substrate 50 using a second adhesion layer 56. The second package substrate 50 and the third semiconductor chips 60 may be covered with a second upper mold portion 70.

Referring to FIGS. 8B and 9, an upper mold hole H3 may be formed in the first upper mold portion 30a to expose the third upper conductive pattern 3d. The first upper mold portion 30a may include a mold top surface U1 and a fourth mold side surface S4. The fourth mold side surface S4 may correspond to an inner sidewall of the upper mold hole H3. The fourth mold side surface S4 may have a surface roughness different from that of the mold top surface U1. The fourth mold side surface S4 may have substantially the same surface roughness as that of the first mold side surface S1 described with reference to FIGS. 3A and 3B. The mold top surface U1 may have substantially the same surface roughness as those of the mold bottom surface B1 and the second mold side surface S2 described with reference to FIGS. 3A and 3B. An upper solder ball 80 may be provided in the upper mold hole H3. The upper solder ball 80 may be formed to connect the third upper conductive pattern 3d with the second lower conductive pattern 52b.

Except for the above-described differences, the semiconductor package according to the present embodiment may be configured to have substantially the same features as those of the previous example embodiments.

FIGS. 10 through 15 are sectional views illustrating a process of fabricating a semiconductor package, whose section is shaped like that shown in FIG. 8B.

Figure 10:
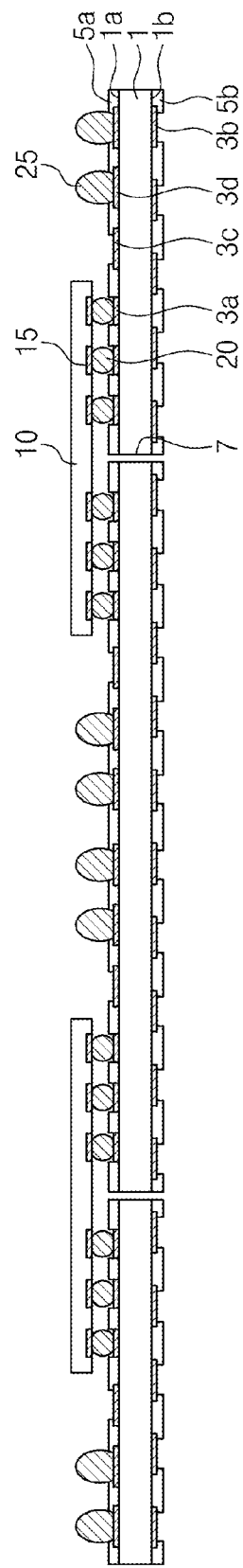

Referring to FIG. 10, a first package substrate 1 may be prepared to include a top surface 1a and a bottom surface 1b facing each other, first to third upper conductive patterns 3a, 3c, and 3d provided on the top surface 1a, a first lower conductive pattern 3b provided on the bottom surface 1b, a hole 7 connecting the top surface 1a with the bottom surface 1b, and an upper insulating layer 5a and a lower insulating layer 5b covering the top surface 1a and the bottom surface 1b, respectively. A first semiconductor chip 10 may be mounted, in a flip-chip bonding manner, on the first package substrate 1.

Figure 11:
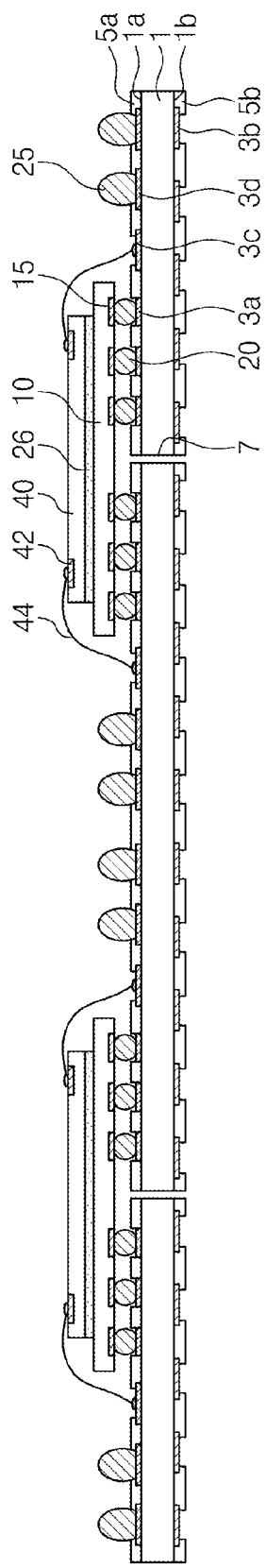

Referring to FIG. 11, a second semiconductor chip 40 may be attached onto the first semiconductor chip 10 with a first adhesion layer 26 interposed therebetween. A second bonding pad 42 of the second adhesion layer 40 may be connected to the second upper conductive pattern 3c using a first wire 44. A first preliminary upper solder ball 25 may be attached onto the third upper conductive pattern 3c.

Referring to FIG. 12, a molding process may be performed to form first upper and lower mold portions 30a and 30b, as previously described.

Referring to FIG. 13, a portion of the lower mold portion 30b covering the first lower conductive pattern 3b may be removed to form a lower mold hole H2 exposing the first lower conductive pattern 3b. The formation of the lower mold hole H2 may be performed by that of the previous example embodiments.

Figure 14:
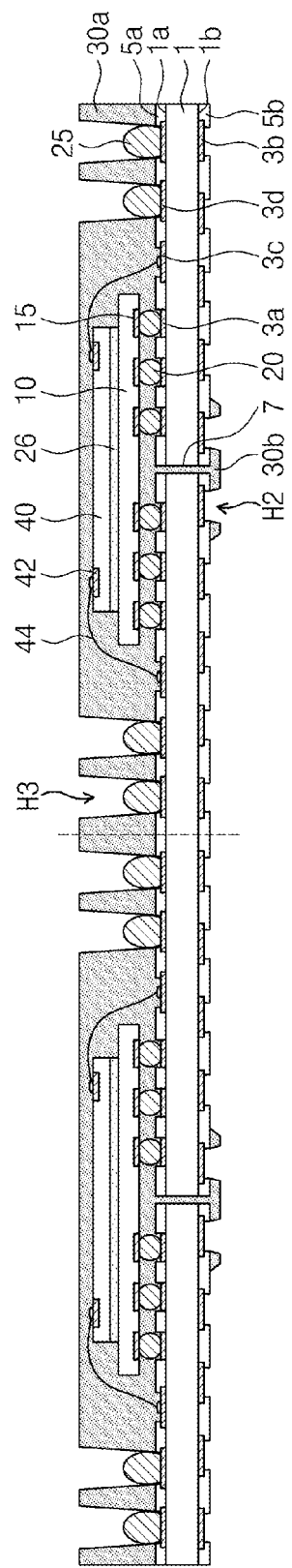

Referring to FIG. 14, a portion of the first upper mold portion 30a may be removed to form an upper mold hole H3 exposing the first preliminary upper solder ball 25. The formation of the upper mold hole H3 may be performed using substantially the same process as that for the lower mold hole H2. For example, the upper mold hole H3 may be formed using a laser (e.g., an infrared laser having a wavelength of about 1064 nm). In some example embodiments, an output power of the laser may be about 7 W. By the use of the laser, the upper mold portion 30a may be heated to a temperature capable of burning off the resin layer or the polymer layer constituting the upper mold portion 30a. For example, in the case where the upper mold portion 30a includes a polymer layer made of an epoxy mold compound, the laser illumination process may be performed in such a way that the upper mold portion 30a is heated to a temperature of about 300-500° C. In some example embodiments, a removal rate of the upper mold portion 30a may be about 650 mm/sec. Accordingly, the third upper conductive pattern 3d may be exposed. Since the third upper conductive pattern 3d may be formed of a reflective material (for example, at least one selected from the group consisting of nickel, lead, gold, and copper), it is possible to prevent the third upper conductive pattern 3d from being damaged by the laser. When a portion of the first upper mold portion 30a is removed by the laser, a portion of the first upper mold portion 30a may also be removed. As the result of the process of removing a portion of the first upper mold portion 30a with the laser, as shown in FIG. 9, the upper mold hole H3 may be formed to expose the first upper mold portion 30a, while a fourth mold side surface S4 may be formed to have a rugged surface.

Figure 15:
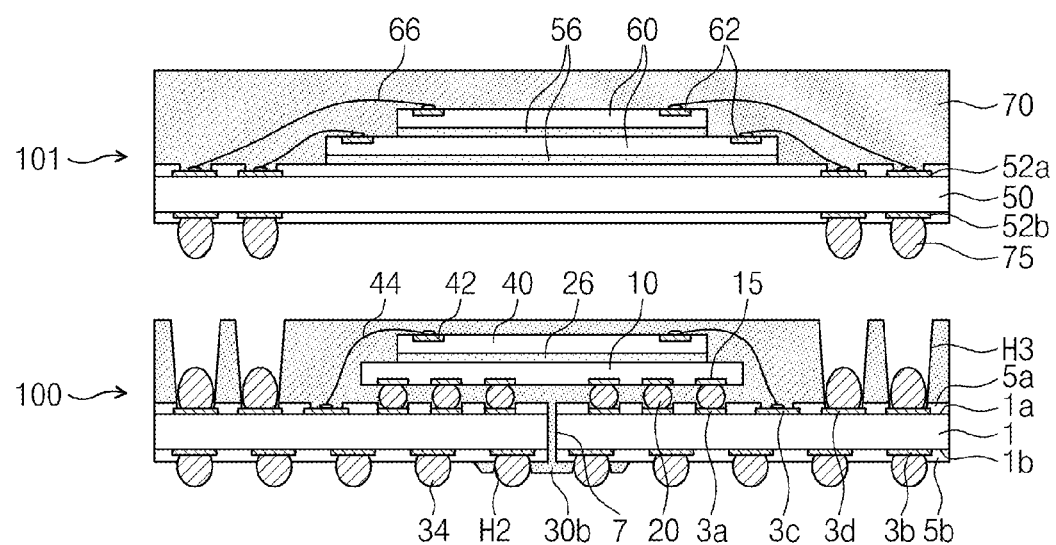

Referring to FIG. 15, a singulation process may be performed to cut the first upper mold portion 30a, the first package substrate 1 and the lower mold portion 30b by unit semiconductor package. Thereafter, the lower solder balls 34 may be attached or welded to the first lower conductive patterns 3b, thereby forming the first semiconductor package 100.

In addition, the second semiconductor package 101 may be fabricated. A second preliminary upper solder ball 75 may be attached to the second lower conductive pattern 52b of the second semiconductor package 101.

The second semiconductor package 101 may be located on the first semiconductor package 100. The second preliminary upper solder ball 75 may be inserted into the upper mold hole H3 to be in contact with the first preliminary upper solder ball 25. The preliminary upper solder balls 25 and 75 may be heated to a temperature of their melting point or more, and therefore, they may be welded to form the upper solder ball 80 that connects the first and second semiconductor packages 100 and 101 electrically with each other, as shown in FIG. 8B. Accordingly, the semiconductor package may be formed to have the package-on-package structure depicted in FIG. 8B.

Except for the above-described differences, the semiconductor package according to the present embodiment may be fabricated using substantially the same process as those of the previous example embodiments.

Still Other Example Embodiments

Figure 16A:
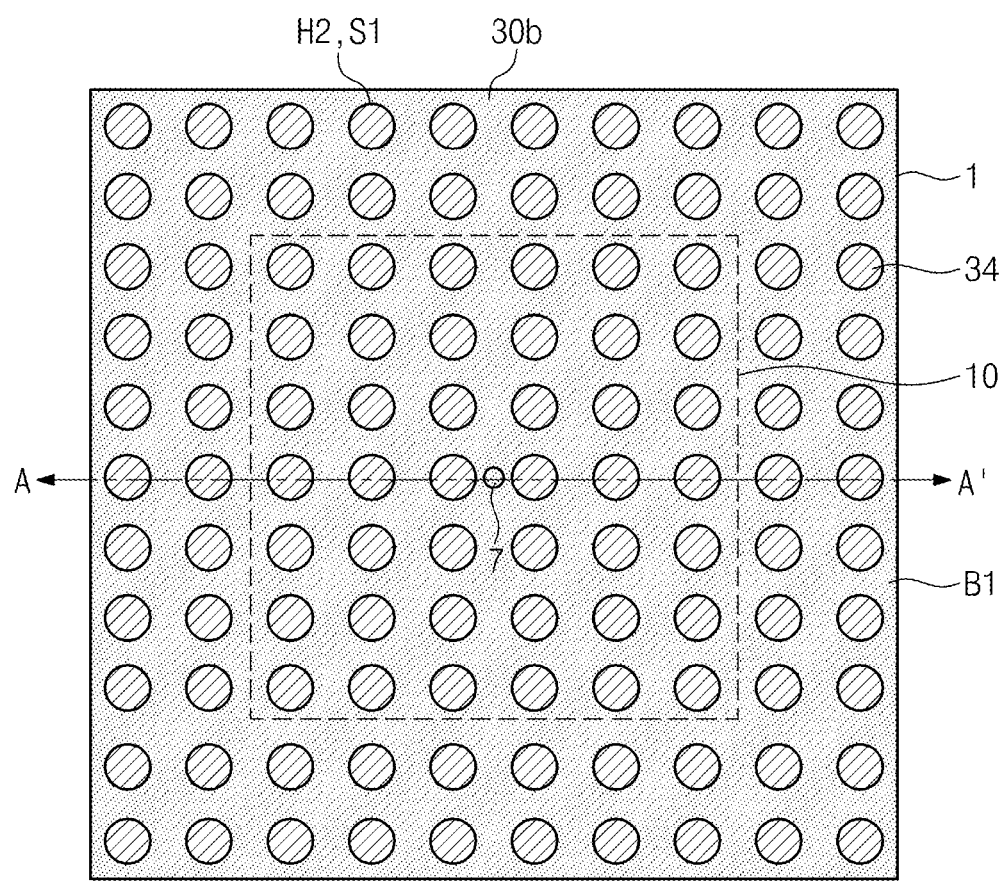
FIG. 16A is a plan view illustrating a bottom surface of a package substrate according to still other example embodiments of inventive concepts.
Figure 16B:
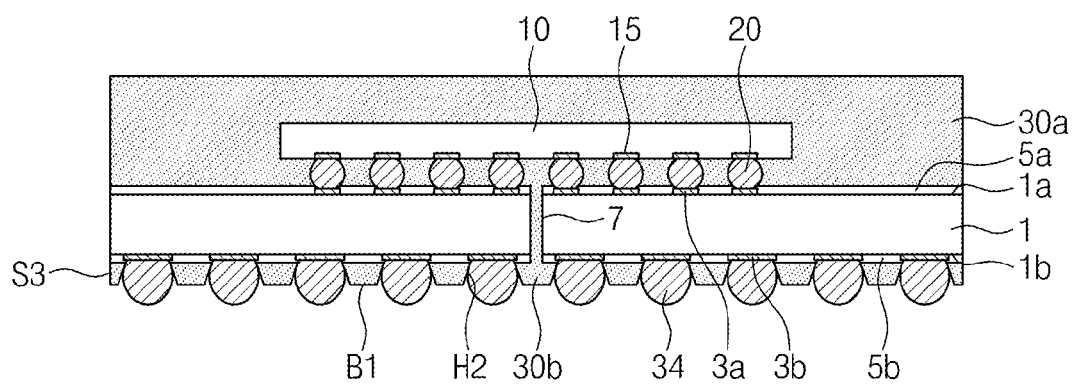
FIG. 16B is a sectional view taken along a line A-A' of FIG. 16A.

FIG. 16A is a plan view illustrating a bottom surface of a package substrate according to still other example embodiments of inventive concepts. FIG. 16B is a sectional view taken along a line A-A' of FIG. 16A.

Referring to FIGS. 16A and 16B, the lower mold portion 30b described with reference to FIGS. 1A and 1B may be formed to entirely cover the bottom surface 1b of the package substrate 1. The lower mold portion 30b may be formed to include a plurality of lower mold holes H2 exposing the lower conductive patterns 5b. In addition, the lower mold portion 30b may be interposed between the lower solder balls 34. Accordingly, the lower mold portion 30b may prevent the lower solder balls 34 from being electrically connected to each other in a reflow process, which may be performed to mount the package substrate 1 onto a mother board. Further, the lower mold portion 30b may be formed to have four third mold side surfaces S3 aligned to side surfaces of the package substrate 1, respectively. In some example embodiments, the lower mold portion 30b may be formed without the second mold side surface S2.

Except for the above-described differences, the semiconductor package according to the present embodiment may be configured to have substantially the same features as those of the previous example embodiments.

In the process of fabricating the semiconductor package of FIGS. 16A and 16B, the lower mold 120 for the mold process may be formed to not have the line-shaped recessed region R1 of FIG. 6B. For example, the entire top surface of the lower mold 120 may be recessed. Accordingly, the second mold side surface S2 may not be formed. Except for the above-described differences, the semiconductor package according to the present embodiment may be fabricated using substantially the same process as those of the previous example embodiments.

Even Other Example Embodiments

Figure 17A:
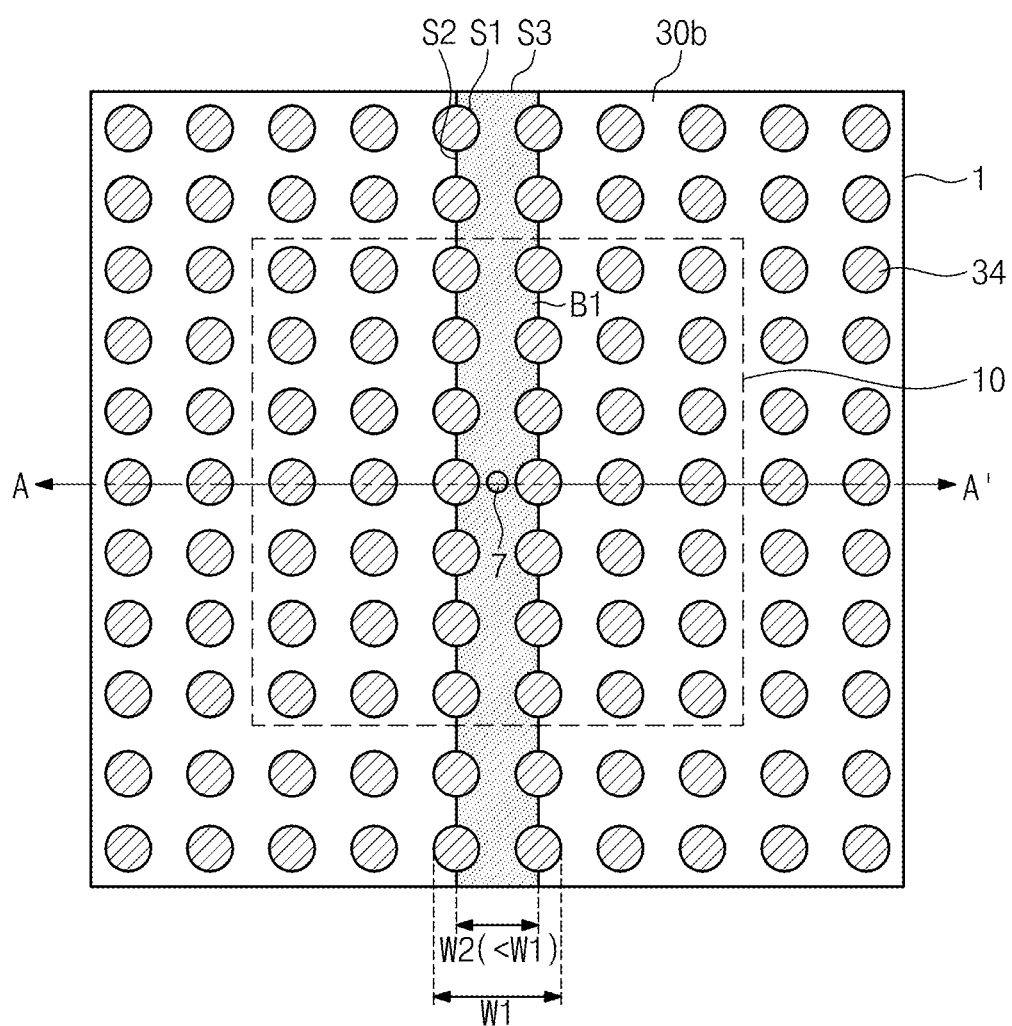
FIG. 17A is a plan view illustrating a bottom surface of a package substrate according to even other example embodiments of inventive concepts.
Figure 17B:
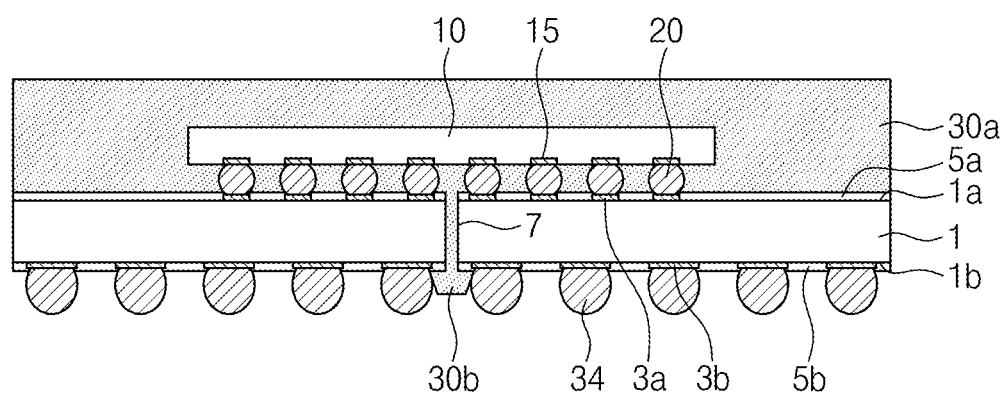
FIG. 17B is a sectional view taken along a line A-A' of FIG. 17A.

FIG. 17A is a plan view illustrating a bottom surface of a package substrate according to even other example embodiments of inventive concepts. FIG. 17B is a sectional view taken along a line A-A' of FIG. 17A.

Referring to FIGS. 17A and 17B, the lower mold portion 30b described with reference to FIGS. 1A and 1B may be formed not to have the lower mold hole H2. For example, a width W2 of the lower mold portion 30b may be smaller than a distance W1 between opposite outer sides of a pair of the lower solder balls 34 that are provided adjacent to a center of the package substrate 1. Accordingly, the lower mold portion 30b may be formed to have a line-shaped structure extending along a column direction and be in partial contact with sidewalls of two columns of the lower solder balls 34 provided adjacent to the center of the package substrate 1. Except for the above-described differences, the semiconductor package according to the present embodiment may be configured to have the substantially same features as those of the previous example embodiments.

In the process of fabricating the semiconductor package of FIGS. 17A and 17B, the lower mold 120 for the mold process may be formed to have a width smaller than that of the line-shaped recessed region R1 of FIG. 6B. For example, the mold process may include forming the mold layer 30a and 30b and then removing a portion of the lower mold portion 30b with a laser. Accordingly, the lower conductive pattern 5b may be exposed and the first mold sidewall S1 adjacent thereto may be formed. Except for the above-described differences, the semiconductor package according to the present embodiment may be fabricated using substantially the same process as those of the previous example embodiments.

Figure 18:
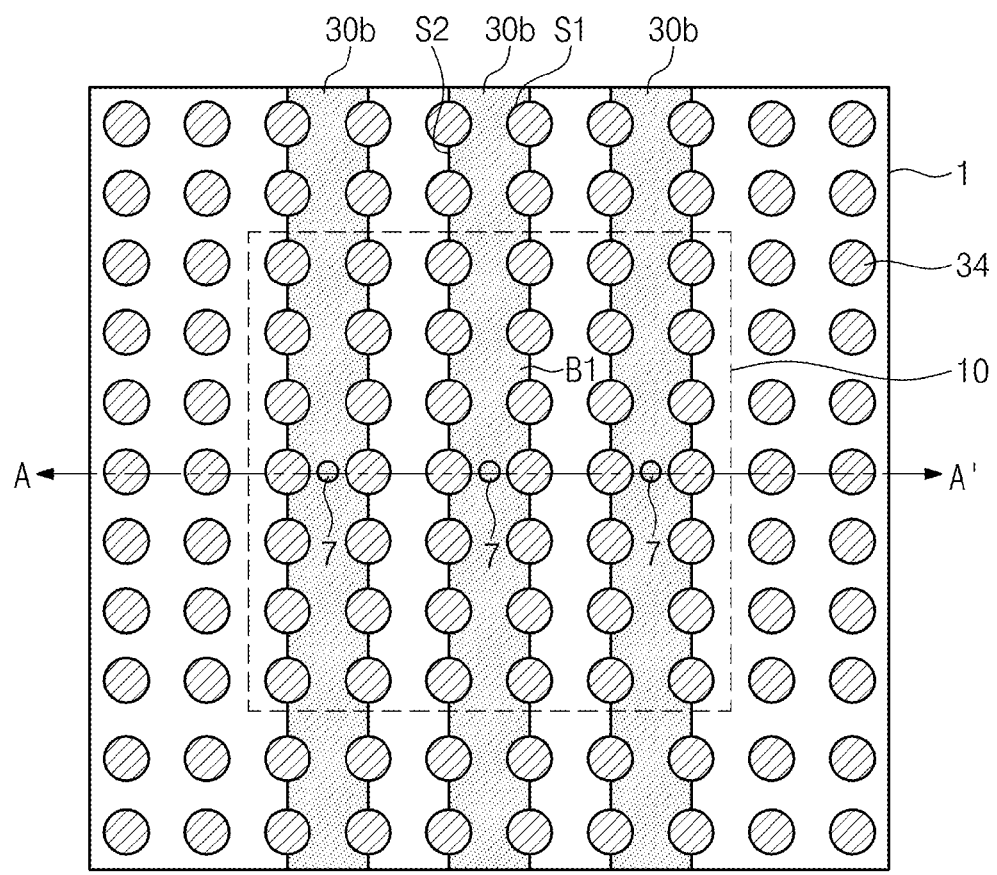
FIGS. 18 and 19 are plan views illustrating a bottom surface of a package substrate according to modifications of some example embodiments of inventive concepts.
Figure 19:
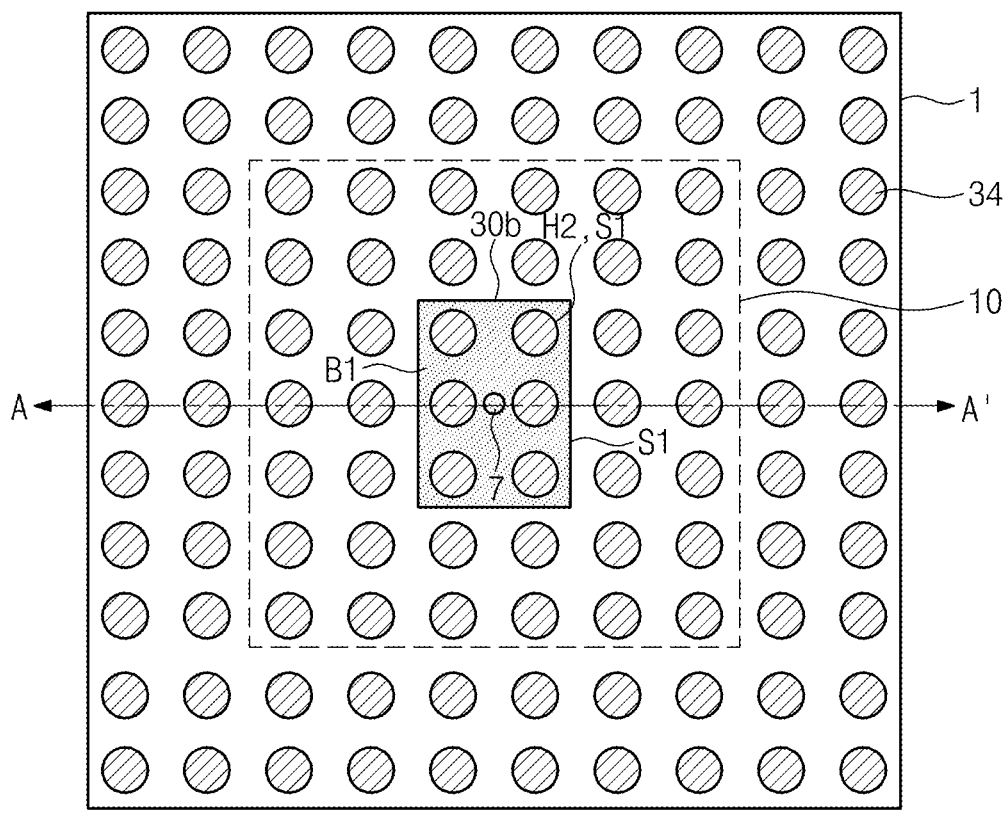

FIGS. 18 and 19 are plan views illustrating a bottom surface of a package substrate according to modifications of some example embodiments of inventive concepts.

As show in FIG. 18, a semiconductor package may include a package substrate 1 provided with a plurality of holes 7 and a plurality of lower mold portions 30b provided on the package substrate 1. In some example embodiments, the lower mold portions 30b may overlap the holes 7, respectively, and each of the lower mold portions 30b may have the planar shape similar to that of FIG. 17A.

As shown in FIG. 19, a semiconductor package may include the lower mold portion 30b provided to cover sidewalls of some (e.g., six) lower solder balls 34 disposed around a hole 7 and expose the remaining ones of the lower solder balls 34. For example, the lower mold portion 30b may be formed using a mold process to have the same planar shape as one depicted in FIG. 1A and then be patterned using a laser drilling process to remain locally around the hole 7. The lower mold portion 30b may be formed to have the first mold sidewall S1, which may be defined by the laser drilling process, without the second and third mold sidewall S2 and S3.

Except for the afore-described features, the semiconductor package according to the present example embodiments may be configured to have the structural or process features identical or similar to those of the previous example embodiments.

The semiconductor package techniques described above may be applied to various kinds of semiconductor devices and package modules including the same.

Figure 20:
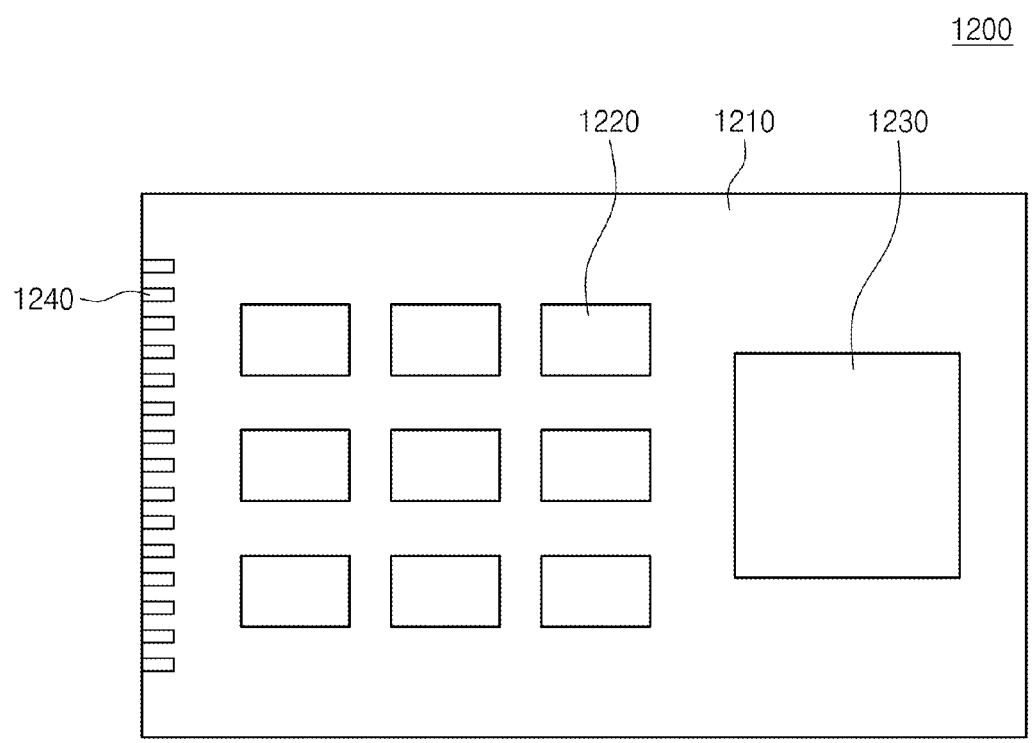
FIG. 20 is a view illustrating an example of package modules including semiconductor packages according to some example embodiments of inventive concepts.

FIG. 20 is a view illustrating an example of package modules including semiconductor packages according to some example embodiments of inventive concepts. Referring to FIG. 20, a package module 1200 may include semiconductor devices 1220 and a semiconductor device 1230 packaged in a quad flat package (QFP) type. Since the semiconductor devices 1220 and 1230 applied with the semiconductor technique according to some example embodiments of inventive concepts are installed on a substrate 1210, the package module 1200 may be formed. The package module 1200 may be connected to an external electronic device through an external connection terminal 1240 disposed at one side of the substrate 1210.

Figure 21:
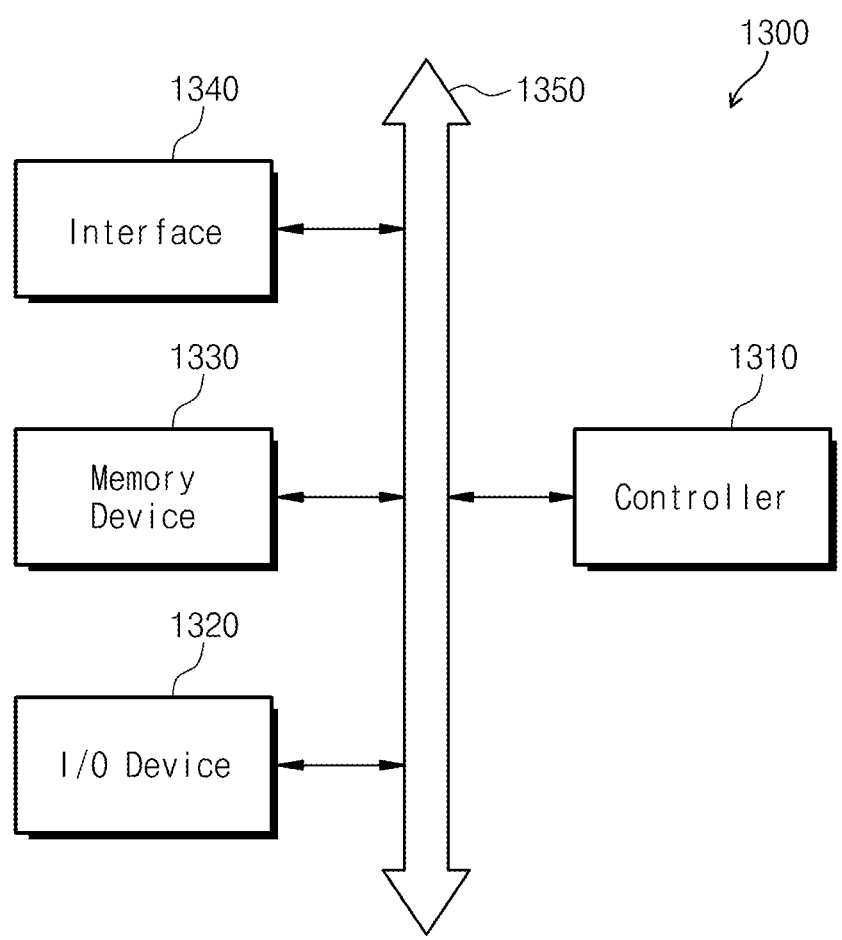
FIG. 21 is a schematic block diagram illustrating an example of electronic systems including semiconductor packages according to some example embodiments of inventive concepts.

The semiconductor package technique described above may be applied to an electronic system. FIG. 21 is a schematic block diagram illustrating an example of electronic systems including semiconductor packages according to some example embodiments of inventive concepts. Referring to FIG. 21, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a flash memory device. The flash memory device may be realized as solid state disks (SSD). The electronic system 1300 may stably store mass data to the flash memory system. The electronic system 1300 may further include an interface unit 1340 that transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 22:
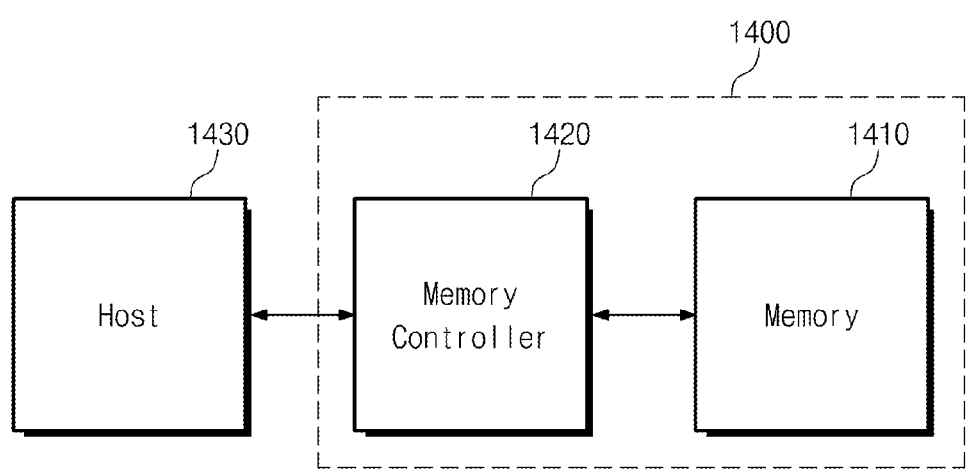
FIG. 22 is a schematic block diagram illustrating an example of memory systems including semiconductor packages according to some example embodiments of inventive concepts.

The semiconductor package technique described above may be applied to a memory system. FIG. 22 is a schematic block diagram illustrating an example of memory systems including semiconductor packages according to some example embodiments of inventive concepts. Referring to FIG. 22, a memory system 1400 may include a non-volatile memory device 1410 and a memory controller 1420. The non-volatile memory device 1410 and the memory controller 1420 may store data or read stored data. The non-volatile memory device 1410 may include at least one of non-volatile memory devices applied with the semiconductor package technique according to some example embodiments of inventive concepts. The memory controller 1420 may control the non-volatile memory device 1410 in order to read the stored data and/or to store data in response to read/write request of a host 1430.

According to some example embodiments of inventive concepts, a semiconductor package is configured to include semiconductor chips that are mounted on a package substrate using a flip-chip bonding technique, and thus the semiconductor package can be operated with an increased speed, due to its shortened signal transmission length. Further, an upper mold portion may be formed to fill a space between the semiconductor chips without any void or with fewer voids, and this improves reliability of the semiconductor package. In addition, the semiconductor package can be realized without using an under-fill resin layer, and lessening a need for a dam preventing an unintentional flow of the under-fill resin solution. Accordingly, it is possible to reduce vertical and/or horizontal sizes of the semiconductor package (or realize a small form factor).

According to other example embodiments of inventive concepts, a semiconductor package is configured to include a lower mold portion provided on a bottom surface of a package substrate. The lower mold portion may be interposed between lower solder balls, thereby preventing electric short between the lower solder balls.

According to some example embodiments of inventive concepts, a package substrate with a hole is used in a process of fabricating a semiconductor package. The hole may serve as an air vent in a process of forming an upper mold portion and maintain a forward flowing of the resin solution for a mold layer. Accordingly, the upper mold portion can be formed to fill a space between semiconductor chips without any void. As a result, it is possible to prevent bumps from being unintentionally connected to each other and reduce technical problems caused by the void filled with moisture. In other words, it is possible to realize a semiconductor package with improved reliability and to increase a production yield. Furthermore, the process can be simplified, because there is no need for the under-fill resin layer.

According to other example embodiments of inventive concepts, during a process of fabricating a semiconductor package, a lower mold portion may be provided to cover a lower conductive pattern on a bottom surface of a package substrate and at least a portion of the lower mold portion may be removed by a laser. Accordingly, the lower solder balls can be freely arranged with less limitation caused by the lower mold portion. In other words, routability of the solder balls can be increased.

While example embodiments of inventive concepts have been particularly shown and described, it will be understood by one of ordinary skill in the art that variations in form and detail may be made therein without departing from the spirit and scope of the attached claims.

What is claimed is:
1. A semiconductor package, comprising:
 a package substrate including at least one non-metallized hole;

at least one lower conductive pattern on a bottom surface of the package substrate;
at least one semiconductor chip mounted on the package substrate in a flip-chip bonding manner; and
a mold layer on the package substrate, the mold layer including,
an upper mold portion covering the at least one semiconductor chip and a top surface of the package substrate,
a lower mold portion including a first mold side surface and connected to the upper mold portion through the at least one non-metallized hole to cover at least a portion of the bottom surface of the package substrate and expose at least a portion of the lower conductive pattern, and the lower mold portion including a mold bottom surface defining a lower mold hole exposing the at least one portion of the lower conductive pattern; and
at least one lower solder ball on the lower conductive pattern, the at least one lower solder ball being in direct contact with the first mold side surface.

2. The semiconductor package of claim 1, wherein
the mold bottom surface is a lowermost surface of the lower mold portion, and
the mold bottom surface has a surface roughness different from that of the first mold side surface.

3. The semiconductor package of claim 2, wherein the mold bottom surface has a first surface roughness, and the first mold side surface has a second surface roughness greater than the first surface roughness.

4. The semiconductor package of claim 2, wherein the first mold side surface corresponds to an inner side surface of the lower mold hole.

5. The semiconductor package of claim 1, further comprising an insulating layer between the bottom surface of the package substrate and the lower mold portion to cover at least a portion of the lower conductive pattern, wherein
the insulating layer includes a lower insulator hole overlapping the lower mold hole, and
an inner width of the lower insulator hole is equivalent to or greater than that of the lower mold hole.

6. The semiconductor package of claim 1, wherein a height from the bottom surface of the package substrate to the mold bottom surface is less than a height from the bottom surface of the package substrate to a bottom of the lower solder ball.

7. The semiconductor package of claim 1, wherein the lower mold portion is between adjacent ones of the lower solder balls.

8. The semiconductor package of claim 3, further comprising an upper solder ball provided on the top surface of the package substrate,
wherein the upper mold portion includes an upper mold hole exposing the upper solder ball, and an inner side surface of the upper mold hole has a surface roughness substantially the same as the second surface roughness.

9. The semiconductor package of claim 8, further comprising an upper semiconductor package provided on the upper mold portion and electrically connected to the package substrate via the upper solder ball.

10. The semiconductor package of claim 1, wherein the lower mold portion one of extends from a first edge of the bottom surface of the package substrate to a second edge of the bottom surface opposite the first edge, and substantially covers the bottom surface of the package substrate.

11. The semiconductor package of claim 2, wherein the lower mold portion has a second mold side surface aligned to a side surface of the package substrate, the second mold side surface having a surface roughness different from the first mold side surface.

12. The semiconductor package of claim 1, wherein the upper mold portion fills a space between the semiconductor chip and the package substrate.

13. A method of fabricating a semiconductor package, the method comprising:
mounting at least one semiconductor chip on a package substrate in a flip-chip bonding manner, the package substrate including a top surface and a bottom surface facing away from each other, at least one non-metallized hole from the top surface to the bottom surface, and at least one lower conductive pattern provided on the bottom surface;
forming a mold layer including an upper mold portion and a lower mold portion, the upper mold portion covering at least a portion of the top surface of the package substrate, the lower mold portion connected to the upper mold portion through the at least one non-metallized hole and covering at least a portion of the bottom surface of the package substrate; and
removing a portion of the lower mold portion to expose at least a portion of the lower conductive pattern.

14. The method of claim 13, wherein the removing a portion of the lower mold portion is performed using a laser.

15. The method of claim 13, further comprising:
attaching a lower solder ball to the lower conductive pattern; and
sequentially cutting the upper mold portion, the package substrate, and the lower mold portion to form unit semiconductor packages separated from each other.

16. The method of claim 13, wherein the package substrate includes a first upper solder ball attached to the package substrate, the first upper solder ball being covered with the upper mold portion,
the method further comprising removing a portion of the upper mold portion to form an upper mold hole exposing at least a portion of the first upper solder ball.

17. The method of claim 16, wherein the removing the portion of the lower mold portion and the removing the portion of the upper mold portion use the same process.

18. The method of claim 16, further comprising:
positioning an upper semiconductor package, the upper semiconductor package including an upper package substrate, an upper semiconductor chip mounted on the upper package substrate, and a second upper solder ball attached to a bottom surface of the upper package substrate, on the upper mold portion so that the first upper solder ball is in contact with the second upper solder ball; and
welding the first and second upper solder balls by providing heat thereto.

19. The method of claim 13, wherein,
the package substrate includes an insulating layer covering the bottom surface of the package substrate and exposing a portion of the lower conductive pattern, and
the removing the portion of the lower mold portion partially removes the insulating layer.

20. A semiconductor package, comprising:
a package substrate;
a lower conductive pattern on a lower surface of the package substrate;
at least one semiconductor chip mounted above an upper surface of the package substrate in a flip-chip bonding manner; and
a mold layer, the mold layer including, an upper mold portion over the at least one semiconductor chip and over at least a portion of the upper surface of the package substrate, a lower mold portion including a mold side surface and covering at least a portion of the lower surface of the package substrate and exposing at least a portion of the lower conductive pattern covered by the lower mold portion, a connecting portion extending through the package substrate via at least one non-metallized hole and integrally connecting the upper mold portion and the lower mold portion; and at least one lower solder ball on the lower conductive pattern, the at least one lower solder ball being in direct contact with the mold side surface.

21. The semiconductor package of claim 20, further comprising:

an insulating layer between the lower surface of the package substrate and the lower mold portion, the insulating layer covering at least a portion of the lower conductive pattern and exposing at least a portion of the lower conductive pattern covered by the insulating layer and exposed by the lower mold portion.

22. The semiconductor package of claim 21, wherein a width of the at least a portion of the lower conductive pattern exposed by the insulating layer is equivalent to or greater than a width of the at least a portion of the lower conductive pattern exposed by the lower mold portion.

23. The semiconductor package of claim 20, wherein the lower mold portion includes:

a bottom surface, the bottom surface being a lowermost surface of the lower mold portion, and the mold side surface connected to the bottom surface where the lower mold portion exposes at least a portion of the lower conductive pattern, the mold side surface having a side surface roughness different than a bottom surface roughness of the bottom surface.

24. The semiconductor package of claim 23, wherein the side surface roughness is greater than the bottom surface roughness.

25. The semiconductor package of claim 23, wherein a height from the lower surface of the package substrate to the bottom surface of the lower mold portion is less than a height from the lower surface of the package substrate to a bottom of the lower solder ball.

26. The semiconductor package of claim 23, further comprising an upper solder ball provided on the upper surface of the package substrate, wherein the upper mold portion exposes at least a portion of the upper solder ball, and an inner side surface of the upper mold portion is substantially the same surface roughness as the side surface roughness of the lower mold portion.

27. The semiconductor package of claim 26, further comprising an upper semiconductor package provided on the upper mold portion and electrically connected to the package substrate via the upper solder ball.

28. The semiconductor package of claim 20, wherein the upper mold portion fills a space between the at least one semiconductor chip and the upper surface of the package substrate.

\* \* \* \* \*